United States Patent
Appel et al.

(10) Patent No.: US 8,159,280 B2
(45) Date of Patent: Apr. 17, 2012

(54) NOISE GENERATOR

(75) Inventors: Leopold Appel, Sieghartskirchen (AT);
Hermann Danzer, Vienna (AT);
Andreas Hofmann, Vienna (AT)

(73) Assignee: Siemens AG Oesterreich, Vienna (AT)

( * ) Notice: Subject to any disclaimer, the term of this patent is extended or adjusted under 35 U.S.C. 154(b) by 0 days.

(21) Appl. No.: 12/685,149

(22) Filed: Jan. 11, 2010

(65) Prior Publication Data

US 2010/0176867 A1    Jul. 15, 2010

(30) Foreign Application Priority Data

Jan. 14, 2009  (DE) .................... 10 2009 004 577

(51) Int. Cl.
*G06F 7/42* (2006.01)
(52) U.S. Cl. ............ 327/361; 327/334; 331/78; 375/295
(58) Field of Classification Search .................. 327/334, 327/361; 331/78; 375/295
See application file for complete search history.

(56) References Cited

U.S. PATENT DOCUMENTS

| | | | |
|---|---|---|---|
| 5,008,845 A | 4/1991 | Adcock | |
| 6,359,936 B1* | 3/2002 | Shyue | 375/295 |
| 6,831,955 B1* | 12/2004 | Takahashi | 375/298 |

FOREIGN PATENT DOCUMENTS

| | | |
|---|---|---|
| DE | 102007038148 A1 | 4/2008 |
| WO | WO 03039046 A1 | 5/2003 |

OTHER PUBLICATIONS

Boyd, "Multitone Signals with Low Crest Factor", IEEE Transactions on Circuits and Systems, Oct. 1986, pp. 1018-1022, vol. CAS-33, No. 10,—1022.

* cited by examiner

*Primary Examiner* — Lincoln Donovan
*Assistant Examiner* — Shikha Goyal

(57) ABSTRACT

A noise generator for generating band-limited noise from a plurality of sinusoidal signals at the same level and equidistant frequency position in the noise spectrum is provided. A noise signal has a low crest factor and for this purpose the phase position of each individual sinusoidal signal is determined.

10 Claims, 7 Drawing Sheets

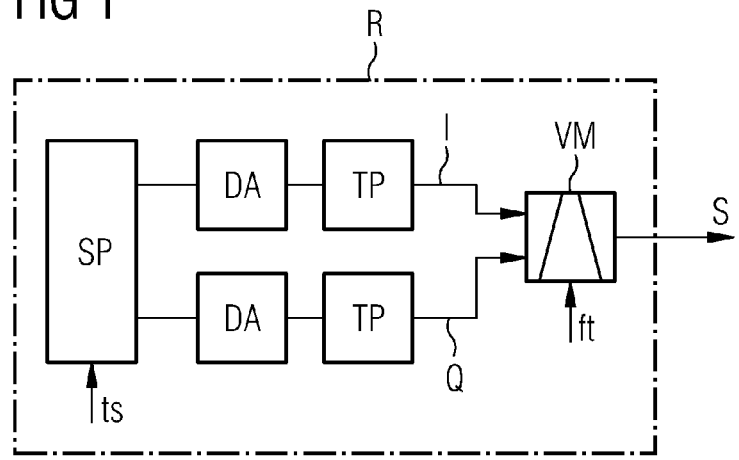
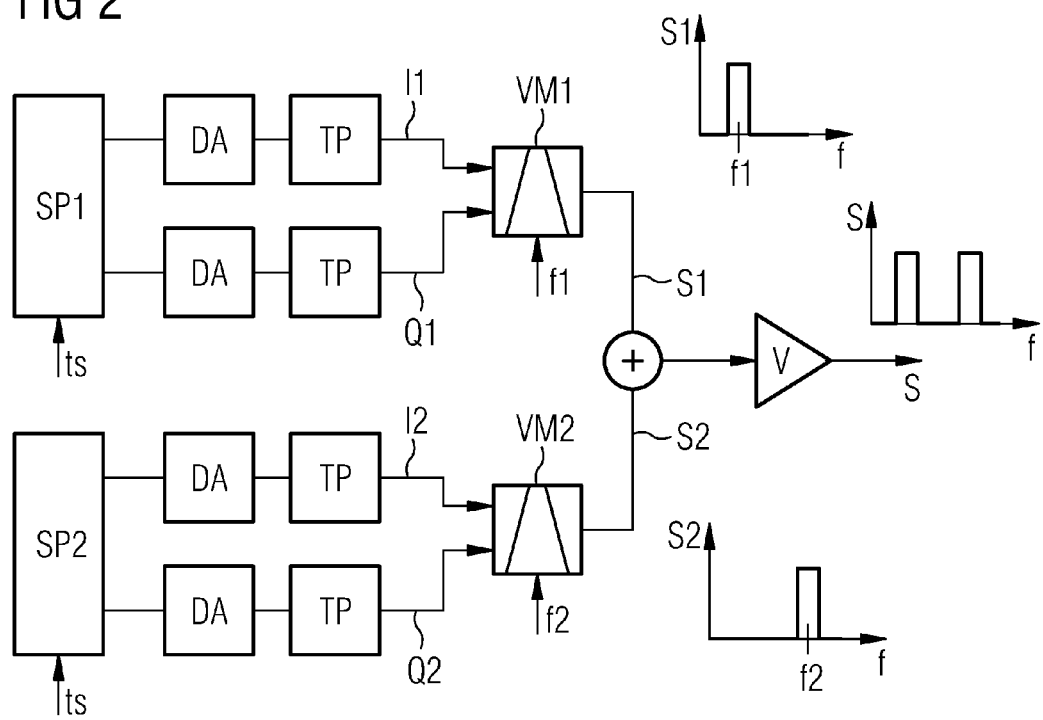

NOISE GENERATOR

CROSS REFERENCE TO RELATED APPLICATIONS

This application claims priority of German Patent Application No. 10 2009 004 577.5 DE filed Jan. 14, 2009, which is incorporated by reference herein in its entirety.

FIELD OF INVENTION

The invention relates to a noise generator for generating a band-limited noise, whose time signal has a low crest factor.

BACKGROUND OF INVENTION

Generators for generating band-limited noise are conventionally implemented using digital technology as analog circuits cannot fulfill the often elevated requirements for low undulation in the noise spectrum, high edge steepness of the noise spectrum and a low signal level outside of the noise spectrum. Such digital noise generators fill the noise spectrum with a (conventionally high) number of equidistant signal lines (individual sinusoidal signals) and generate a severely limited noise spectrum. It is also possible to generate a noise spectrum with gaps using noise generators of this kind. However, the associated noise signals (in the time domain) often have a high crest factor, and in real applications this leads to intermodulation owing to the non-linearities of the amplification stages in the analog signal path, resulting in broadening of the noise spectrum and whereby large numbers of interfering components outside of the desired noise spectrum occur. To solve this problem suitable signal line phase relations with each other are sought. A phase optimization method is described in "Multitone Signals with low Crest Factor; Stephen Boyd, IEEE Transactions on Circuits and Systems, vol. CAS-33, No. 10", by way of example, which determines the phases of the individual signal lines according to:

$$\varphi_k = \frac{\pi(k-1)^2}{N}$$

However, it is not possible to generate a noise spectrum with gaps and a low crest factor using this method.

In certain applications the requirements for minimal interfering components outside of the desired noise spectrum is particularly high, however. By way of example, particularly high requirements in relation to the interfering components outside of the desired frequency spectrum are placed on noise generators which are meant to suppress reception of certain mobile communications frequencies in aircraft. The noise spectra that are to be generated by such generators conventionally have gaps. These requirements cannot be fulfilled by noise generators according to the prior art.

DE 10 2007 038 148 A1 describes a method which by summing the outputs of a plurality of noise-FM signals generates a dither that is both band-limited and also better approximates a uniform probability distribution.

WO 03/039046 A1 discloses a simulator for radio channels which generates noise signals by summing several partial noise signals. The crest factor of a noise signal generated in this manner cannot be sufficiently reduced using this method, however.

U.S. Pat. No. 5,008,845 discloses a method for generating fast sweep signals (chirps) whose spectrum exhibits a flat characteristic. The problem of generating a signal with minimal crest factor is not solved by this method either.

SUMMARY OF INVENTION

An object of the invention is to disclose a noise generator that can generate any desired noise spectrum with gaps and wherein the generated signal has a low crest factor.

The object is achieved by a device according to the independent claim. Advantageous embodiments are the subject matter of the dependent claims.

According to the basic idea of the invention, a noise generator is constructed which by means of a vector modulator modulates the I and Q signal components of a noise signal to a carrier frequency. The noise signal is advantageously obtained by means of digital-analog conversion from sampled values stored in a memory.

According to the invention it is provided that the noise signal is obtained by means of summing any desired number of sinusoidal equidistant individual signals that are in the frequency range of the desired noise band, wherein the phase position of each individual sinusoidal signal k is predefined according to $$\varphi_k = 2\pi T_{START} k + \frac{\pi k^2 (T_{STOP} - T_{START})}{N} + \frac{C\pi(k - N/2)^4}{(N/(T_{STOP} - T_{START}))^2}$$

where
N is the number of sinusoidal signals,
$T_{STOP}$ represents any desired value between 0 and 1,
$T_{START}$ represents any desired value between 0 and 1,
and $T_{STOP} > T_{START}$, and
C represents any desired positive value.

A noise signal of this kind created from a number N of sinusoidal signals each with phase position $\varphi_k$ resembles what is known as a periodic sweep signal.

The linear term ($2\pi T_{START} k$) provided in the determination of $\varphi_k$ brings about a temporal shift of the entire signal by $T_{START}$.

The factor ($T_{STOP} - T_{START}$) provided in the determination of $\varphi_k$ in the quadratic term $$\left( \frac{\pi k^2 (T_{STOP} - T_{START})}{N} \right)$$

brings about a temporal compression of the signal which ends at $T_{STOP}$.

The value ranges of $T_{START}$ and $T_{STOP}$ lie between 0 and 1, with 0 representing the start and 1 the end of a signal period (of the sweep-like signal).

The $4^{th}$ order term provided in the determination of $$\varphi_k \left( \frac{C\pi(k - N/2)^4}{(N/(T_{STOP} - T_{START}))^2} \right)$$

brings about a slowing down of the temporal course of the sweep-like signal at the start and end of the signal period. This slowing down lowers the amplitudes in the region of the start and stop frequencies and therefore reduces the inter modulation products of the start and stop frequencies and increases the edge steepness of the noise spectrum.

The variable C provided in the determination of $\phi_k$ brings about a change in the level of the signal at the start and end of the signal period as well as a temporal extension of the signal. The envelope of the temporal characteristic of the signal can be adjusted by suitably selecting variable C, whereby an optimally constant characteristic of this envelope may be achieved. It is therefore possible to reduce the crest factor of the signal further.

A gap can be inserted in the temporal characteristic of the signal by means of the parameters $T_{START}$ and $T_{STOP}$. This is advantageous with noise spectra that do not have gaps in the frequency range as suitable selection of $T_{START}$ and $T_{STOP}$ means that the edge steepness of the noise spectrum can be optimized and, in particular, the intermodulation products outside of the noise spectrum can be minimized. A temporal gap in the region of approx. 5% to 7% has achieved good results.

Using the inventive noise generator it is possible to achieve the advantage of the generated noise signals having a very low crest factor and of therefore causing only very small intermodulation products in the subsequent amplification stages. These intermodulation products are produced by the unavoidable non-linearities of the amplification stages and can only be reduced using complex circuitry. If, however, amplification stages with a high efficiency level are used, there are no other possibilities for reducing these intermodulation products. However, owing to the time signal with the low crest factor that it generates the inventive noise generator produces only extremely small intermodulations on the non-linearities of subsequent amplification stages.

It is advantageous to calculate the sampled values of the I and Q signal components of a noise signal in accordance with the disclosed method and to store these sampled values in a memory from which the I and Q signal components of the noise signal are read during operation of the noise generator. An inventive noise generator can therefore be constructed which requires only very low (or, when appropriate digital circuitry is used, no) computing power.

A further advantageous embodiment of the invention provides that the output signals of a plurality of noise generators are summed. It is thereby possible to achieve the advantage of being able to jointly feed a plurality of different noise spectra to an amplification stage and therefore being able to generate a (total) noise spectrum with gaps, wherein the advantages of an inventive noise generator are retained.

It is particularly advantageous in this connection that it is possible to generate a noise spectrum with gaps in which the individual sub-noise bands can each have different signal levels (signal powers).

For this purpose it is necessary to temporally stagger the individual signals of the sub-noise bands and to output them with short time gaps within one signal period, each signal having the same amplitude and therefore producing a constant total noise signal envelope. The different signal levels (powers) of the individual sub-noise bands are achieved by means of the appropriate temporal allocation of the signal period. A time slot in the signal period is allocated to each sub-noise band (or its noise signal) using the parameters $T_{START}$ and $T_{STOP}$ the duration of the respective time slot being equivalent to the relative noise output of the sub-noise band in relation to the total noise output, and the power of the sub-noise band being determined in accordance with the product of noise bandwidth and amplitude.

It is also possible to generate a noise spectrum with gaps using a generator if the sampling frequency used allows all desired sub-noise bands to be generated.

It is advantageous to select the parameters $T_{START}$ and $T_{STOP}$ such that the signals of the individual sub-noise bands (which are generated by separate sub-noise generators) are output separately (successively) in the time domain as the intermodulation products can be particularly well suppressed as a result. It is also advantageous to generate the signals of the individual sub-noise bands in separate sub-noise generators if the individual sub-noise bands are widely separated from each other in the frequency range, and owing to the high sampling frequency required it is not possible for one noise generator alone to generate them.

The noise spectrum generated by means of the inventive noise generator has a longitudinal structure as the cyclical output of sampled values from a memory with infinite capacity cannot generate what is known as real random noise.

One particular embodiment of the invention therefore provides that a phase modulation of the carrier frequency supplied to the vector modulator is performed. The individual spectral lines forming the noise spectrum are widened as a result, so a continuous spectrum is produced.

A further particular embodiment of the invention provides that when generating a noise spectrum with gaps the individual sub-noise bands have a flattened (less steep) edge in the frequency range. As a result the intermodulation products of the sub-noise bands may be (practically completely) reduced among themselves as the corresponding time signals no longer temporally overlap in the frequency range owing to this measure. Shaping of the edges in the frequency range by means of a quadratic cosine function has proven to be particularly expedient in this connection.

BRIEF DESCRIPTION OF THE DRAWINGS

By way of example in the drawings:

FIG. 1 shows a noise generator.

FIG. 2 shows a noise generator for generating a noise spectrum with gaps.

DETAILED DESCRIPTION OF INVENTION

FIG. 1 shows by way of example and schematically the basic construction of an inventive noise generator. The noise generator R comprises a memory SP, two digital-to-analog converters DA, two low-pass filters TP and a vector modulator VM. The sampled values for what is known as the inphase channel and what is known as the quadrature channel are stored in the memory SP. These sampled values are periodically read out at the speed predefined by the clock signal ts and are supplied to two digital-to-analog converters DA, one digital-to-analog converter DA respectively being provided per (inphase or quadrature) channel. The analog signal converted in this manner is supplied to one low-pass filter TP respectively which suppresses the image frequencies that are produced during digital-analog conversion. The signals (inphase signal I and quadrature signal Q) generated by means of low-pass filtering are supplied to a vector modulator VM. From the inphase signal I and the quadrature signal Q the vector modulator VM generates a noise signal S which is brought into the desired frequency position by means of carrier signal ft.

FIG. 2 shows by way of example and schematically the block diagram of a noise generator for generating a noise spectrum with gaps.

FIG. 2 shows two sub-noise generators which are each constructed according to the block diagram shown in FIG. 1. These two sub-noise generators comprise one memory SP1 or SP2 respectively, two digital-to-analog converters DA respectively, two low-pass filters TP respectively and one vector modulator VM1 or VM2 respectively. The frequency position of the noise signal of the first sub-noise generator is determined by the frequency of the first carrier signal f1, the frequency position of the noise signal of the second sub-noise generator is determined by the frequency of the second carrier signal f2.

The noise signal S1 of the first sub-noise generator and the noise signal S2 of the second sub-noise generator are fed to a summing point and the aggregate signal that results in this manner is amplified by means of an amplifier V. This amplified summed signal forms the noise signal S. FIG. 2 also shows the spectra of the first noise signal S1, of the second noise signal S2 and the totaled and amplified noise signal S. The spectrum of the noise signal S (which represents the desired output signal of the noise generator) includes the two individual spectra of the (sub)noise signals S1 and S2 which are each located centered around the frequency of their carrier signal f1 or f2.

Figure 3:
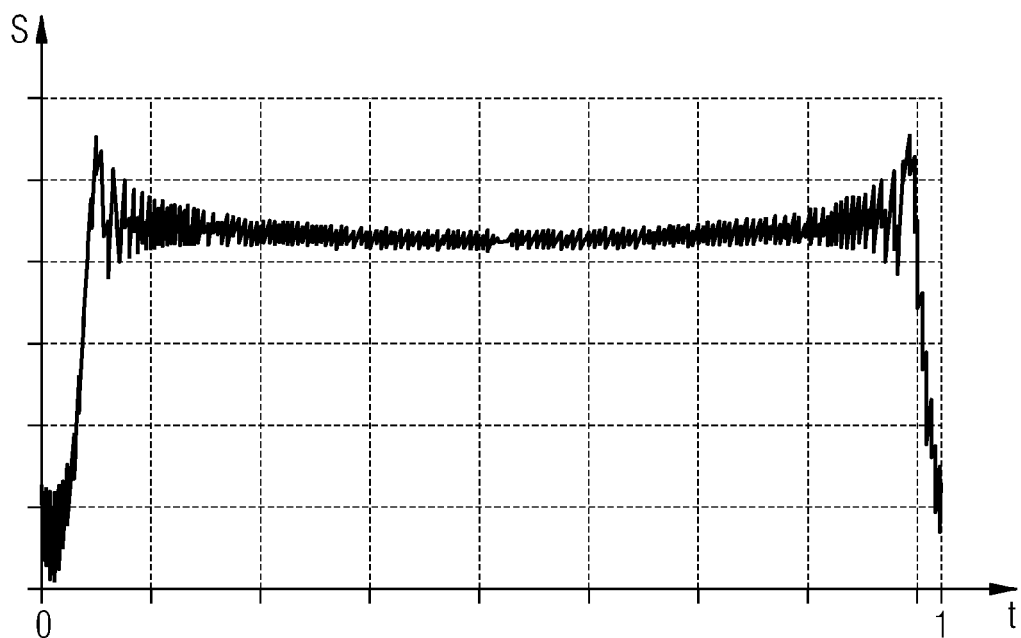
FIG. 3 shows an envelope of a typical noise signal over a signal period.

FIG. 3 shows by way of example and schematically a simulation of the temporal characteristic of the envelopes of a typical noise signal over a signal period. In this example the parameter C is allocated the value zero and no additional temporal shift is provided ($T_{START}=0$, $T_{STOP}=1$).

Figure 4:
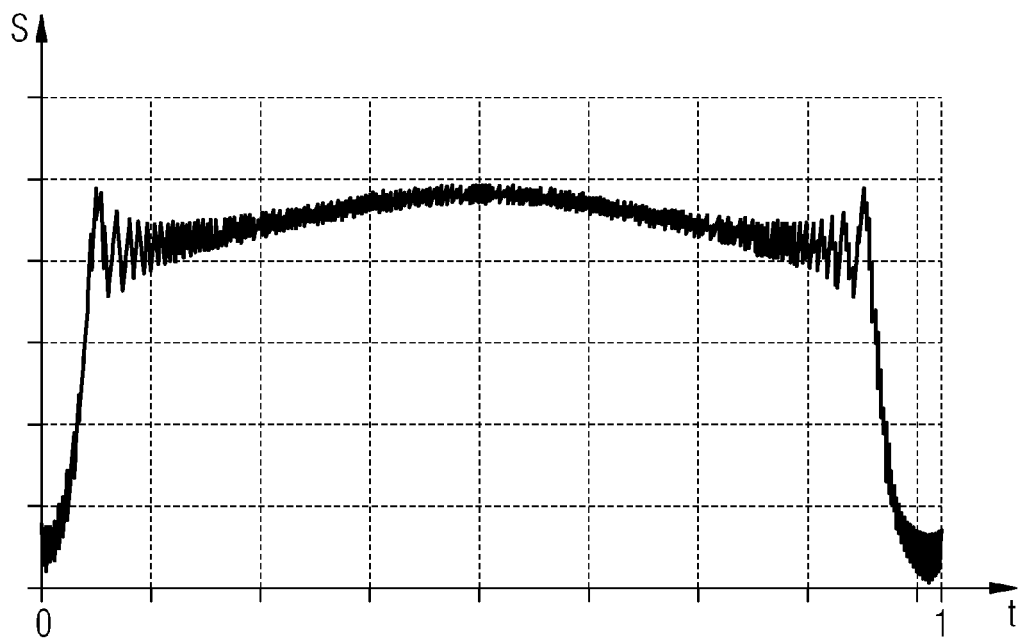
FIG. 4 shows an envelope of a typical noise signal over a signal period with temporal shift and C=0.05%.

FIG. 4 shows by way of example and schematically a simulation of the temporal characteristic of the envelopes of a typical noise signal over a signal period. In this example the parameter C is allocated the value 0.05% and an additional temporal shift of 3% of the signal period duration is provided.

Figure 5:
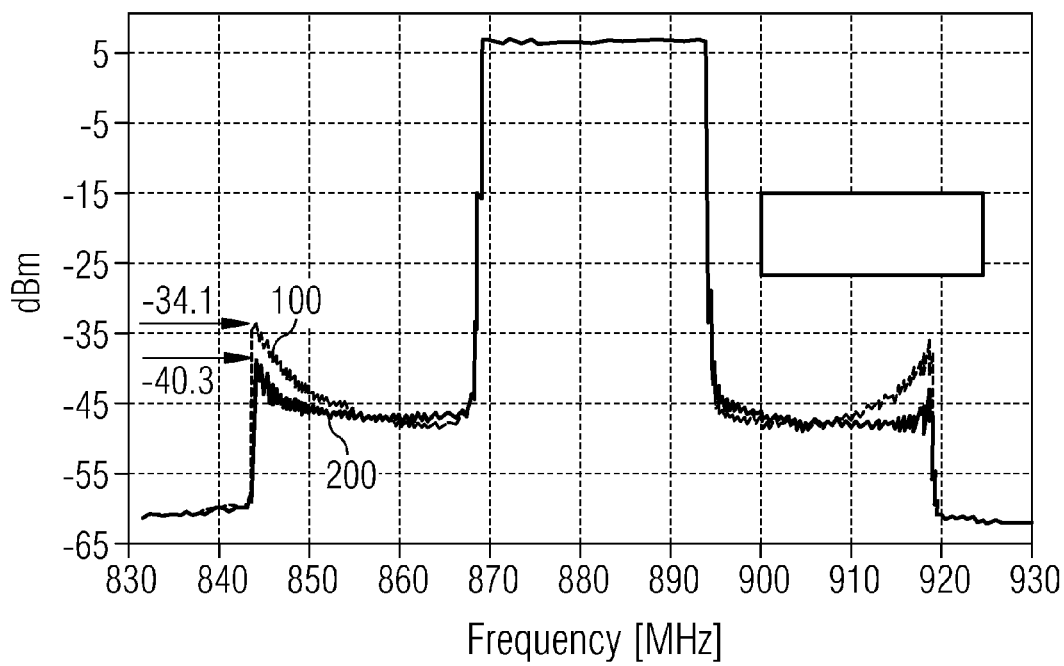
FIG. 5 shows measuring results of a breadboard of an inventive noise generator.

FIG. 5 shows by way of example and schematically measuring results of a breadboard of the inventive noise generator. Two noise spectra are shown superimposed and in the frequency range from approx. 868 MHz to approx. 894 MHz have a constant characteristic. The one noise spectrum 100 corresponds to a time signal, as is shown in FIG. 3, and does not have any additional temporal gap ($T_{START}=0$, $T_{STOP}=1$) and has a parameter C=0.

The other noise spectrum 200 corresponds to a time signal as is shown in FIG. 4.

Figure 6:
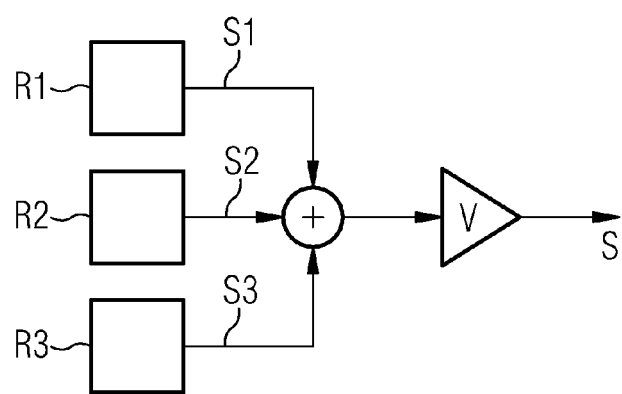
FIG. 6 shows a block diagram of a noise generator for generating three noise bands.

FIG. 6 shows by way of example and schematically the block diagram of a noise generator for generating three noise bands. The output signals (noise signals) S1, S2, S3 of three separate noise generators R1, R2, R3 (which each have a construction according to FIG. 1) are summed in a summing point and amplified by means of an amplifier V. The output signal of the amplifier V forms the noise signal S.

Figure 7:
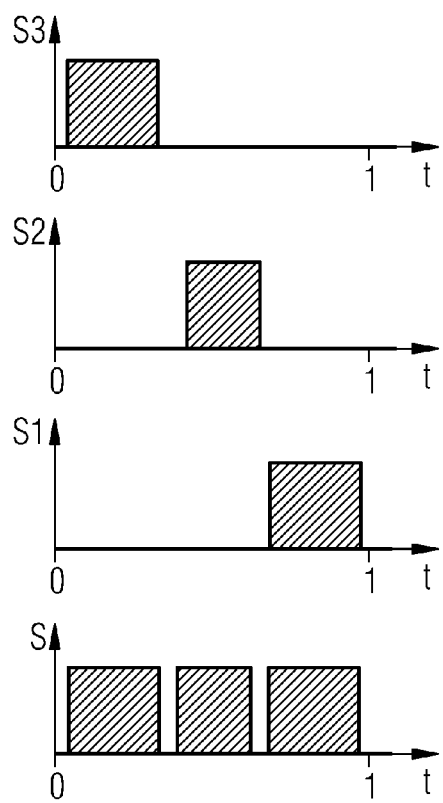
FIG. 7 shows the characteristic of the envelopes of the noise signals of a noise generator according to FIG. 6.

FIG. 7 shows by way of example and schematically the temporal characteristic of the envelopes of the noise signals of a noise generator according to FIG. 6 over a signal period. A time slot, which does not overlap with any other time slot (of another signal respectively) is allocated to each of the three individual noise signals S1, S2, S3. The noise signal S is the sum of the three individual noise signals S1, S2, S3.

Figure 8:
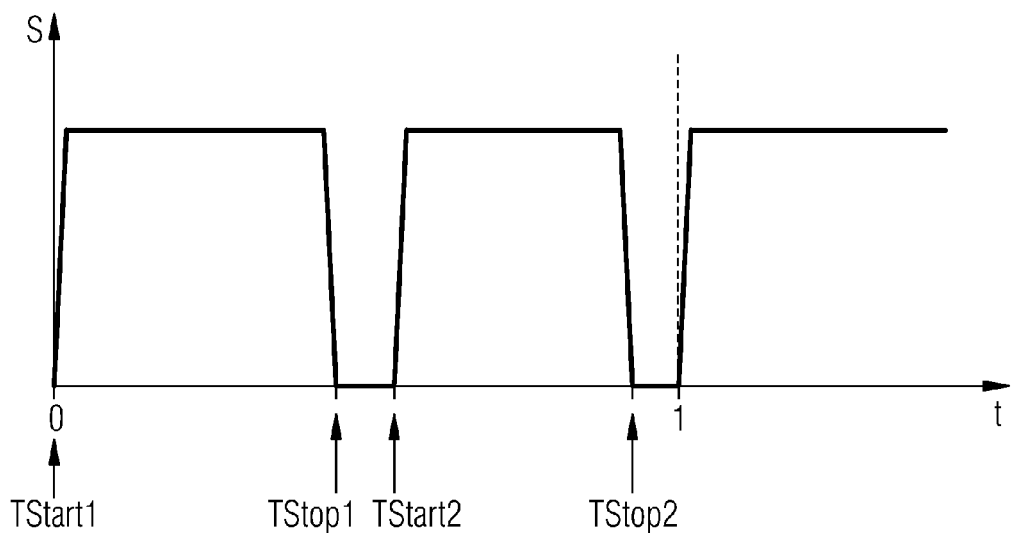
FIG. 8 shows the temporal characteristic of the envelopes of a summed noise signal from two individual noise signals over a signal period.

FIG. 8 shows by way of example and schematically the temporal characteristic of the envelopes of a summed noise signal from two individual noise signals over a signal period (from time 0 to time 1).

A first noise signal occupies a first time slot from time TStart1 to time TStop1, a second noise signal occupies a second time slot from time TStart2 to time TStop2. A temporal gap is provided between the two time slots in the period from TStop1 to TStart2, and likewise in the period from TStop2 to the end of the period at time 1.

Figure 9:
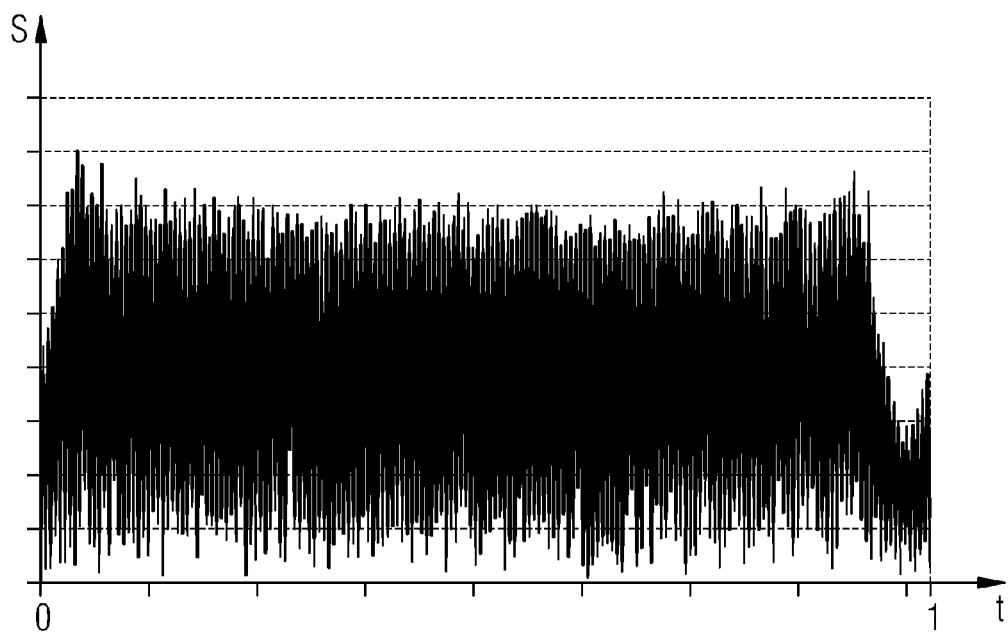
FIG. 9 shows a simulation of the temporal characteristic of the envelopes of a noise signal from three sub-noise signals over a signal period without time slots.

FIG. 9 shows by way of example and schematically a simulation of the temporal characteristic of the envelopes of a noise signal over a signal period. This noise signal, shown in FIG. 9, has been produced by summing three individual noise signals which each fill the entire signal period from 0 to 1.

Figure 10:
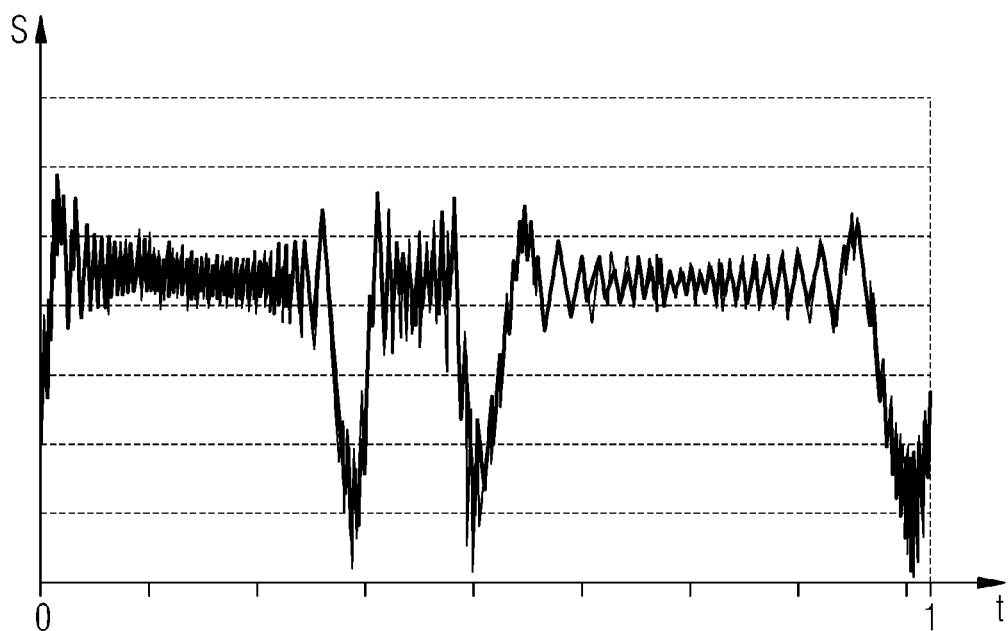
FIG. 10 shows a simulation of the temporal characteristic of the envelopes of a noise signal from three sub-noise signals over a signal period with three separate time slots.

FIG. 10 shows by way of example and schematically a simulation of the temporal characteristic of the envelopes of a noise signal over a signal period. This noise signal, shown in FIG. 9, has been produced by summing three individual noise signals which were each allocated to separate time slots, and whose length was determined in accordance with the respective output of the individual noise band.

Figure 11:
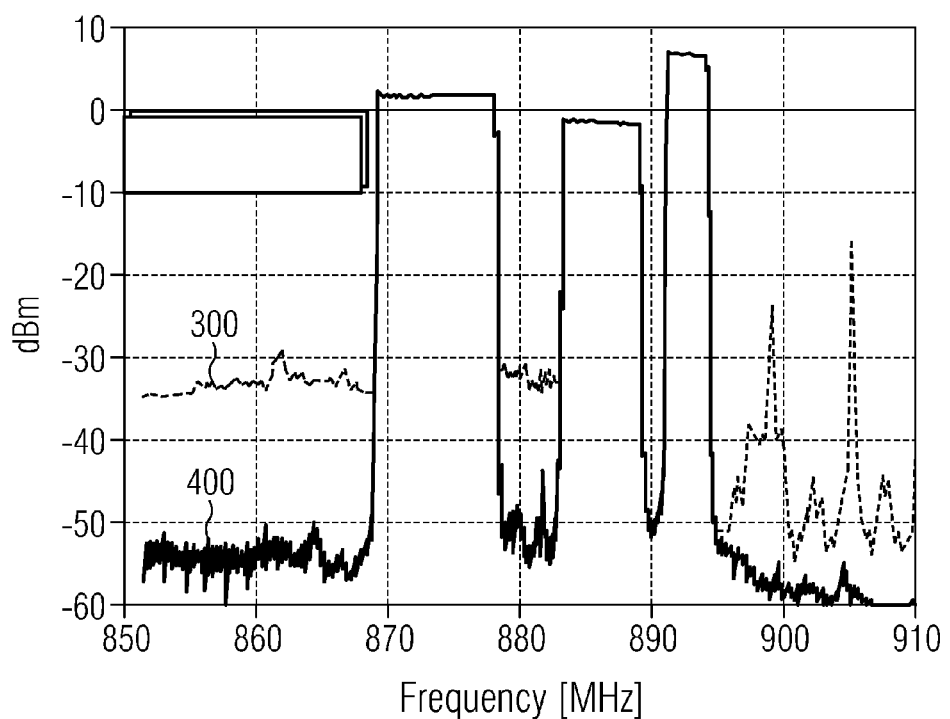
FIG. 11 shows the measuring results of a breadboard of an inventive noise generator for generating a noise spectrum with gaps.

FIG. 11 shows by way of example and schematically measuring results of a breadboard of an inventive noise generator for generating a noise spectrum with gaps. Two noise spectra are shown superimposed and each have three sub-noise spectra in the frequency range from approx. 868 MHz to approx. 894 MHz. Each of these sub-noise spectra has a specific output different from other sub-noise spectra. The one noise spectrum 300 corresponds to a time signal, as is shown in FIG. 9, the other noise spectrum 400 corresponds to a time signal, as is shown in FIG. 10. The additional suppression of the intermodulation products by about 20 dB can be seen and this is achieved by dividing the noise signal into separate time slots.

Figure 12:
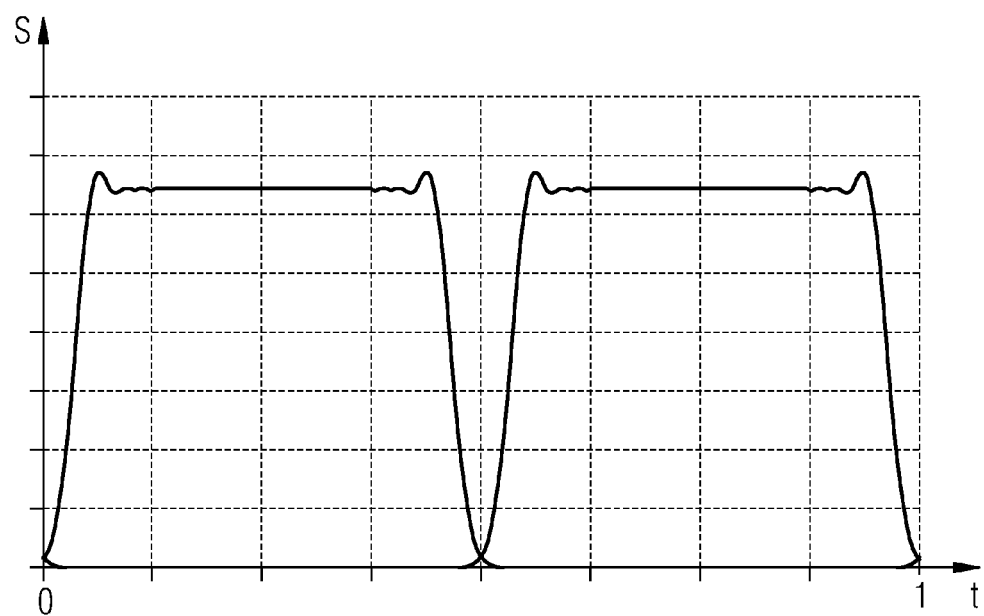
FIG. 12 shows a simulation of the temporal characteristic of the envelopes of a noise signal over a signal period with edge shaping in accordance with a $\cos^2$ function.

FIG. 12 shows by way of example and schematically a simulation of the temporal characteristic of the envelopes of a noise signal over a signal period. This noise signal, shown in FIG. 12, has been produced by summing two individual noise signals which were each allocated to separate time slots and whose rising and falling edges are each flattened in accordance with a cos² function.

Figure 13:
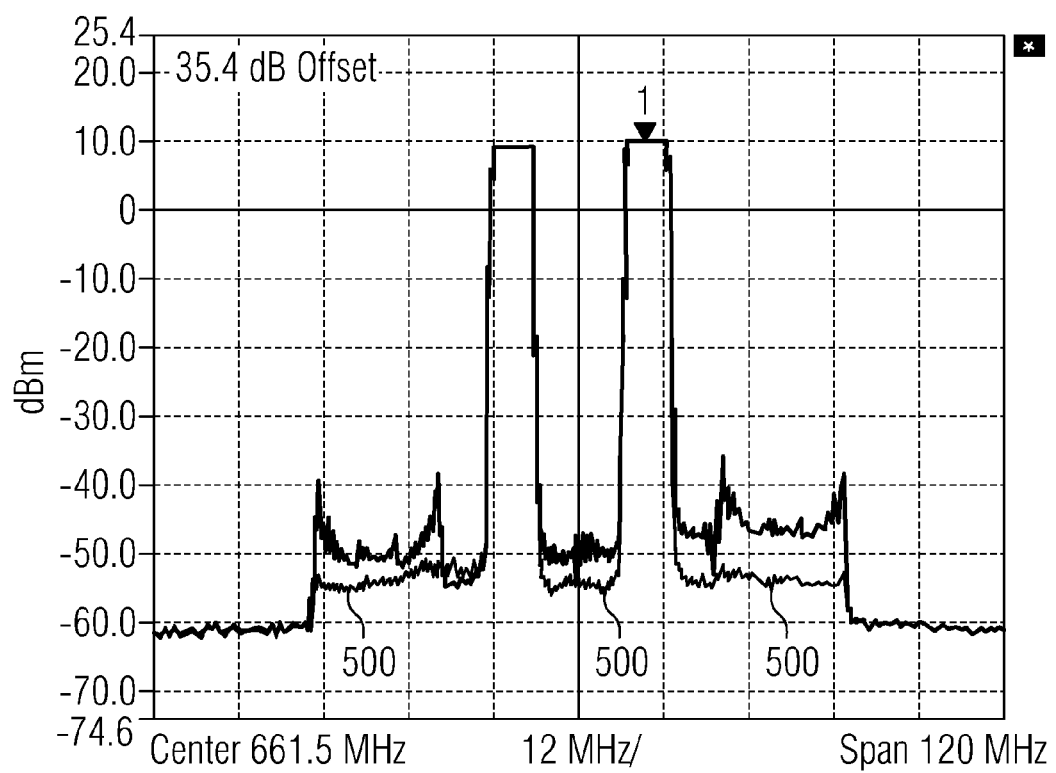
FIG. 13 shows the measuring results of a breadboard of an inventive noise generator with edge shaping of the envelopes of the time signal in accordance with a cos² function.

FIG. 13 shows by way of example and schematically measuring results of a breadboard of an inventive noise generator for generating a noise spectrum with gaps. Two noise spectra are shown superimposed and cover the same noise bands and are at the same level. Outside of the noise spectra the signal according to FIG. 12 (with edge shaping in accordance with a cos² function) has a much lower level of intermodulation products than the second noise spectrum which does not have edge shaping.

The invention claimed is:

1. A noise generator for generating a band-limited noise:
a memory to store respective digital samples of an in-phase (I) signal component and a quadrature (Q) signal component of a noise signal;
respective digital-to-analog converters coupled to the memory to supply respective digital signals respectively corresponding to the in-phase (I) signal component and the quadrature (Q) signal component of the noise signal; and
a vector modulator responsive to a carrier frequency to modulate in a baseband the respective digital signals respectively corresponding to the in-phase (I) signal component and the quadrature (Q) signal component of the noise signal, wherein the vector modulator generates a plurality of sinusoidal signals at a same level and equidistant frequency position in a noise spectrum,
wherein the vector modulator is configured to determine a phase position for each individual sinusoidal signal of the plurality of sinusoidal signals according to $$\varphi_k = 2\pi T_{START} k + \frac{\pi k^2 (T_{STOP} - T_{START})}{N} + \frac{C\pi (k - N/2)^4}{(N/(T_{STOP} - T_{START}))^2}$$

wherein
k represents the individual sinusoidal signal,
N represents the plurality of sinusoidal signals,
$T_{STOP}$ represents any desired value between 0 and 1,
$T_{START}$ represents any desired value between 0 and 1, and wherein $T_{STOP} > T_{START}$, and
C represents any desired positive value.

2. The noise generator as claimed in claim 1, wherein the carrier frequency is phase modulated.

3. The noise generator as claimed in claim 1, wherein a noise spectrum with gaps is generated by summing individual noise signals, each individual noise signal occupying separate time domains of a signal period.

4. The noise generator as claimed in claim 2, wherein a noise spectrum with gaps is generated by summing individual noise signals, each individual noise signal occupying separate time domains of a signal period.

5. The noise generator as claimed in claim 3, wherein the envelope of the noise signal has a constant level and the lengths of the separate time domains are determined in accordance with the outputs of the individual noise bands.

6. The noise generator as claimed in claim 4, wherein the envelope of the noise signal has a constant level and the lengths of the separate time domains are determined in accordance with the outputs of the individual noise bands.

7. The noise generator as claimed in claim 1, wherein the edges of the noise spectrum are formed in accordance with a cos²-function.

8. The noise generator as claimed in claim 2, wherein the edges of the noise spectrum are formed in accordance with a cos²-function.

9. The noise generator as claimed in claim 3, wherein the edges of the noise spectrum are formed in accordance with a cos²-function.

10. The noise generator as claimed in claim 4, wherein the edges of the noise spectrum are formed in accordance with a cos²-function.

* * * * *